United States Patent [19]

Ozaki et al.

[11] Patent Number: 4,956,692
[45] Date of Patent: Sep. 11, 1990

[54] SEMICONDUCTOR DEVICE HAVING AN ISOLATION OXIDE FILM

[75] Inventors: Hiroji Ozaki; Masahiro Yoneda; Ikuo Ogoh; Yoshinori Okumura; Wataru Wakamiya; Masao Nagatomo, all of Hyogo, Japan

[73] Assignee: Mitsubishi Denki Kabushiki Kaisha, Tokyo, Japan

[21] Appl. No.: 266,704

[22] Filed: Nov. 3, 1988

[30] Foreign Application Priority Data

Nov. 9, 1987 [JP] Japan .................. 62-282567

[51] Int. Cl.$^5$ ........................................... H01L 27/12
[52] U.S. Cl. ..................... 357/49; 357/23.6; 357/55
[58] Field of Search ............ 357/23.6, 51, 49, 55, 357/55 C

[56] References Cited

U.S. PATENT DOCUMENTS

| 4,688,064 | 8/1987 | Ogura et al. ............ 357/23.6 |
| 4,819,054 | 4/1989 | Kawaji et al. ............ 357/49 |

FOREIGN PATENT DOCUMENTS

| 0154871 | 9/1985 | European Pat. Off. ........... 357/23.6 |
| 50-53883 | 12/1976 | Japan . |
| 50-72591 | 12/1976 | Japan . |
| 62-123764 | 6/1987 | Japan ................... 357/23.6 |

OTHER PUBLICATIONS

IEDM 84: "Trench Capacitor Leakage in MBIT DRAMS", by M. Elahy et al., 9.6, 1984, pp. 248-251.

Primary Examiner—Rolf Hille
Assistant Examiner—Courtney A. Bowers
Attorney, Agent, or Firm—Lowe, Price, Leblanc, Becker & Shur

[57] ABSTRACT

Two trenches are formed at a predetermined distance on a main surface of a semiconductor substrate. An oxide film and a nitride film are successively formed on the main surface of the semiconductor including the inner surfaces of the trenches. After a resist is formed over the whole surface including the inner surfaces of the trenches, the resist is patterned to expose a portion of the nitride film on a side surface of each trench. The exposed portions of the nitride film are removed by using the patterned resist as a mask and thermal oxidation is applied. Then, an isolation oxide film is formed on a region between the trenches and an end of a bird's beak is located on a side surface of each trench and is connected to the oxide film formed in each trench.

4 Claims, 9 Drawing Sheets

SEMICONDUCTOR DEVICE HAVING AN ISOLATION OXIDE FILM

BACKGROUND OF THE INVENTION

1. Field of the Invention

The present invention relates to semiconductor devices and particularly to a semiconductor device having an isolation oxide film near trenches provided in a semiconductor substrate and a method of manufacturing thereof.

2. Description of the Prior Art

Recently, semiconductor devices have been remarkably developed and various proposals have been made to accomplish a large scale integration in dynamic random access memories (DRAMs) without deteriorating the storage characteristics thereof.

FIG. 1 is a block diagram showing an example of a construction of a general DRAM. A memory cell array 101 comprises a plurality of word lines and a plurality of bit lines arranged to intersect with each other and memory cells are provided at respective intersections of those word lines and bit lines. A memory cell is selected for each intersection of one word line selected by an X address buffer decoder 102 and one bit line selected by a Y address buffer decoder 102. Data is written into the selected memory cell or the data stored in the memory cell is read out therefrom. An instruction for writing or reading of data is given by a read/write (R/W) control signal supplied to an R/W control circuit 104. In writing data, input data Din is applied to a selected memory cell through the R/W control circuit 104. On the other hand, in reading data, the data stored in the selected memory cell is detected and amplified by a sense amplifier 105 and the amplified output is provided to outside as output data Dout through a data output buffer 106.

FIG. 2 is an equivalent circuit diagram of a dynamic type memory cell shown for explanation of write/read operation of a memory cell.

Referring to FIG. 2, the dynamic type memory cell comprises a field effect transistor 108 and a capacitor 109. The gate electrode of the filed effect transistor 108 is connected to a word line 110 and the source/drain electrode thereof connected to the capacitor 109 is connected to a bit line 107. In writing data, the field effect transistor 108 is conducted by application of a predetermined charge to the word line 110 and accordingly a charge applied to the bit line 107 is stored in the capacitor 109. On the other hand, in reading data, the field effect transistor 110 is conducted by application of a predetermined charge to the word line 110 and accordingly the charge stored in the capacitor 109 is taken out through the bit line 107. Thus, a storage capacity of the memory cell is dependent on the capacity of the capacitor 109. Consequently, in order to increase an integration scale of a memory cell array, trench memory cells are developed in which trenches are formed on a semiconductor substrate and a charge storage region is formed on the inner surfaces of each trench, making it impossible to maintain or increase the storage capacities of the memory cells.

FIG. 3 is a plan view of a dynamic RAM hereinafter referred to as DRAM) of a folded bit line system using trench memory cells and FIG. 4 is a sectional view taken along the line IV—IV in FIG. 3. Those trench memory cells are disclosed for example in a lecture No. 9.6 of the International Electron Device Meeting of 1984 (IEDM '84).

Referring to FIGS. 3 and 4, a plurality of memory cells 12 are formed on a surface of a p type semiconductor substrate 1 and those memory cells 12 are isolated from each other by an isolation oxide film 8. Each memory cell 12 comprises a charge storage region 16 for storing a charge, a transfer gate 18, and an n type impurity region 20 connected to a bit line 22. The charge storage region 16 comprises a trench 5 formed in the main surface of the semiconductor substrate 1 (corresponding to a region surrounded by solid lines in FIG. 3), and an n+ impurity region 30 formed on a part of the main surface of the semiconductor substrate 1, including the inner walls of the trench 5, an oxide film 32 for capacitor covering the inner walls of the trench 5, and a cell plate 28 formed by polysilicon or the like to fill the trench 5 through the oxide film 32. The transfer gate region 18 comprises a channel region 34 between the impurity region 20 and the n+ impurity region 30, and a word line 26 formed by polysilicon or the like to be a gate electrode over the channel region 34. The impurity region 20, the transfer gate 18 and the n+ impurity region 30 constitute a switching transistor. Data write/read operation in FIG. 2 will be described referring to FIG. 4.

In data write operation, when a predetermined charge is applied to the word line 26, an inversion layer is formed in the channel region 34 and accordingly the impurity region 20 and the n+ impurity region 30 are conducted. Consequently, a charge applied to the bit line 22 is transferred to the charge storage region 16 through the invented channel region 34 and it is stored in the n+ impurity region 30. On the other hand, in data read operation, a predetermined charge is applied to the word line 26 to cause the charge stored in the n+ impurity 30 to pass through the inverted channel region 34 and to be taken out to outside through the impurity region 20 and the bit line 22.

The amount of the charge thus stored depends on an area of the n+ impurity 30 facing the trench 5, that is, the area of the inner walls of the trench 5 and accordingly formation of the trench 5 contributes to a large charge storage capacity compared with the plane area occupied by the charge storage region 16. More specifically, formation of the trench 5 and the trench capacitor utilizing the trench 5 makes it possible to ensure the capacitor having a relatively large capacity for charge storage with respect to a small area occupied by a fine memory cell.

In such a DRAM having trenches developed based on the above described background, an isolation oxide film 8 for isolation of adjacent cells is provided as shown in FIG. 4 so as to prevent mutual interference of the charges stored in the capacitors of the adjacent cells. Therefore, as the cells are made microscopic, a distance between the isolation oxide film 8 and the trench 5 concerned is unavoidably reduced.

FIGS. 5A to 5E are schematic sectional views showing steps of a conventional method of manufacturing an isolation oxide film formed near trenches.

In the following, this manufacturing method will be described referring to the figures.

First, an oxide film 111 is formed on a main surface of a semiconductor substrate 1 and an isolation oxide film 8 is formed by a well-known LOCOS method by using as a mask a nitride film 112 patterned in a predetermined form on the oxide film 111 (as shown in FIG. 5A).

Then, after the nitride film 112 and the oxide film 111 are removed, an oxide film 113 is formed on the main surface of the semiconductor substrate 1 and a nitride film 114 is further formed over the whole surface of the oxide film 113 as well as the isolation oxide film 8. An oxide film 115 to be used as a mask for etching trenches in the subsequent step is formed with a predetermined thickness on the nitride film 114 by a CVD method. Then, resist is formed on the oxide film 115 and a photolithographic process is applied thereto, whereby the resist 118 is patterned to have openings 117 corresponding to positions of trenches to be formed (as shown in FIG. 5B).

After the oxide film 115 is etched by using the resist 118 as a mask, the resist 118 is removed and the etching for forming trenches is applied to the semiconductor substrate 1 including the nitride film 114 and the oxide film 113 by using the etched oxide film 115 as a mask, whereby trenches 5 of a predetermined shape are formed (as shown in FIG. 5C).

Subsequently, wet etching is applied to remove the oxide film 115 used as the mask for the etching for formation of the trenches. On this occasion, the nitride film 114 is not etched; however, the oxide film 113 and the isolation oxide film 8 functioning as buffer materials between the nitride film 114 and the semiconductor substrate 1 are partially removed at the same time since those films face the inner walls of the trenches 5 (as shown in FIG. 5D).

Finally, after the nitride film 114 is removed and the remaining oxide film 113 is removed, another oxide film 116 is formed by the CVD method over the whole area of the main surface of the semiconductor substrate 1 including the inner walls of the trenches 5, whereby the isolation oxide film 8 for isolation of the adjacent elements between the trenches 5 is formed (as shown in FIG. 5E).

FIG. 6 is an enlarged sectional view showing the isolation oxide film 8 and the oxide film 116 around a trench 5 formed as shown in FIG. 5E.

In FIG. 6, an angle formed between a side surface of a trench 5 and the main surface of the semiconductor substrate 1 is acute on the side of the isolation oxide film 8 compared with the angle (about 90°) on the opposite side. This tendency is particularly noticeable in the case where an end of the isolation oxide film 8 and the side surface of the trench 5 become close due to a microscopic size of each cell and a flat area of the main surface of the semiconductor substrate 1 does not exist in that portion, as is evident from FIG. 5C. In such a case, a thickness of the oxide film 116 in an edge portion "a" of the trench 5 on the side of the isolation oxide film 8 is very small. Since a dielectric strength of the oxide film 118 is defined by the film thickness in this portion, there are involved various disadvantages such as increase of initial failure or the like and lowering of reliability.

Since the film thickness of the oxide film 116 in this edge portion is particularly decreased by the CVD method, a method of forming an oxide film by sacrificial oxidation is often adopted to avoid such decreased.

According to this method, a thermal oxidation film including an edge portion of a trench is formed in an atmosphere at a high temperature of about 1050° C. or more and that film is removed and thermal oxidation is further applied to form an oxide film with the edge portion being made round. However, if the film thickness of the oxide film at the edge portion becomes equal to that of the flat portion by using this method, the dielectric strength and the reliability of the oxide film are not improved so much compared with those in a flat structure. This is because a large residual stress caused by formation of the isolation oxide film 8 exist in a main surface portion (b) of the semiconductors substrate 1 between the edge portion (a) and the isolation oxide film 8, causing deterioration of adhesion with the oxide film 116.

SUMMARY OF THE INVENTION

An object of the present invention is to provide a semiconductor device having high reliability.

Another object of the present invention is to provide a semiconductor device having an isolation oxide film formed near trenches without lowering the reliability of an oxide film at edge portions of the trenches.

Another object of the present invention is to provide a semiconductor device having an isolation oxide film formed near trenches without lowering the dielectric strength of an oxide film at edge portions of the trenches.

A further object of the present invention is to provide a method of manufacturing a semiconductor device exerting no influence on surrounding portions of a trench due to the formation of the trench.

A still further of the object of the present invention is to provide a method of manufacturing a semiconductor device, in which an edge of a trench does not have an acute angle.

A still further object of the present invention is to provide a method of manufacturing a semiconductor device in which an end of a bird's beak of an isolation oxide film is located on a side surface of a trench.

A still further object of the present invention is to provide a method of manufacturing a semiconductor device, making it possible to reduce an adverse effect of residual stress due to formation of an isolation oxide film near trenches.

A still further object of the present invention is to provide a method of manufacturing a semiconductor device, not requiring sacrificial oxidation for protection of an oxide film at an edge portion of each trench at the time of forming an isolation oxide film near the trenches.

In order to accomplish the above described objects, a semiconductor device according to the present invention comprises: a semiconductor substrate having a main surface on which trenches are formed, a plurality functional elements formed on the semiconductor substrate, and an isolation oxide film formed on the main surface of the semiconductor substrate near the corresponding trenches for isolating the functional elements, with a bird's beak of the isolation oxide film being located on a side surface of the corresponding trench.

In order to accomplish the above described objects, a method of manufacturing a semiconductor device according to the present invention comprises the steps of: preparing a semiconductor substrate having a main surface, forming trenches of a predetermined form on the main surface of the semiconductor substrate, and forming an isolation oxide film on the main surface of the semiconductor substrate by thermally oxidizing a region adjacent to each trench.

In order to accomplish the above described objects, a method of manufacturing a semiconductor device according to an aspect of the present invention comprises the steps of: preparing a semiconductor substrate having a main surface, forming trenches of a predetermined form on the main surface of the semiconductor substrate, forming an insulating film on the main surface of the semiconductor substrate including inner walls of the trenches, removing only portions of the insulating film on a first predetermined region of the main surface of the semiconductor substrate facing each trench and on a second predetermined region of a side surface of each trench connecting the related first predetermined region, and forming an isolation oxide film on the main surface of the semiconductor substrate and the side surface of each trench exposed by the removal of the above described portions of the insulating film.

The semiconductor device thus constructed has a high reliability because an end of a bird's beak of the isolation oxide film is located on the side surface of each trench and accordingly an edge of each trench never has an acute angle, i.e., the side surface of the trench and the surface of the substrate form an edge having an angle which is greater than an acute angle.

In the above described method of manufacturing a semiconductor device, the isolation oxide film is formed after formation of the trenches and accordingly the formation of the trenches does not exert any adverse effect on the surrounding portions.

In addition, according to an aspect of the above described method of manufacturing a semiconductor device, the oxidation step is applied after the partial removal of the insulating film on the side surface of each trench and accordingly an end of a bird's beak of the isolation oxide film is formed on the side surface of each trench.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 7A to 7E are schematic sectional views showing steps of a manufacturing method according to an embodiment of the present invention.

Referring to the figures, the manufacturing method will be described.

Figure 7A:
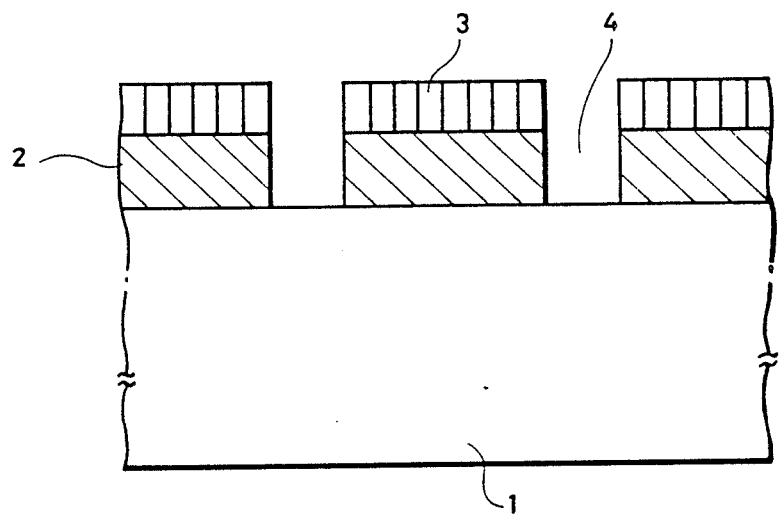
FIGS. 7A to 7E are schematic sectional views showing steps of a manufacturing method according to an embodiment of the present invention.

First, an oxide film 2 of a predetermined thickness is formed on a main surface of a semiconductor substrate 1 such as a silicon substrate by a CVD method. In a CMOS process, this oxide film 2 is formed immediately after island regions are formed. In an NMOS process, this oxide film 2 is formed at the beginning of the process. In the following description of the present invention, other steps such as an impurity injection step and an impurity diffusion step are omitted for the purpose of clearly explaining the characteristic features of the present invention. However, it should be noted that both of the steps are suitably executed during the below described steps. A resist is formed over the whole surface on the oxide film 2 of the predetermined thickness used as a mask and a photolithographic process is applied thereto to form a patterned resist 3 having openings corresponding to positions where trenches are to be formed. Using the resist 3 as a mask, the exposed oxide film 2 is etched and removed (as shown in FIG. 7A).

Figure 7B:
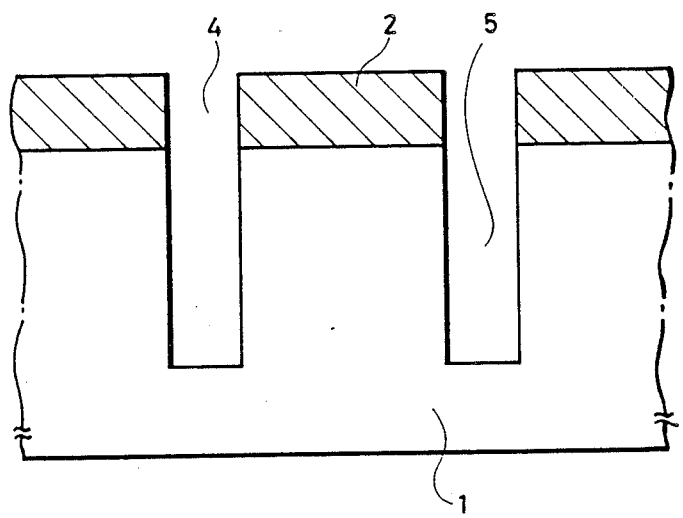

Then, the resist 3 is removed and using the etched oxide film 2 as a mask, etching for the formation is applied to the semiconductor substrate 1, whereby trenches 5 of a predetermined form are formed (as shown in FIG. 7B).

Figure 7C:
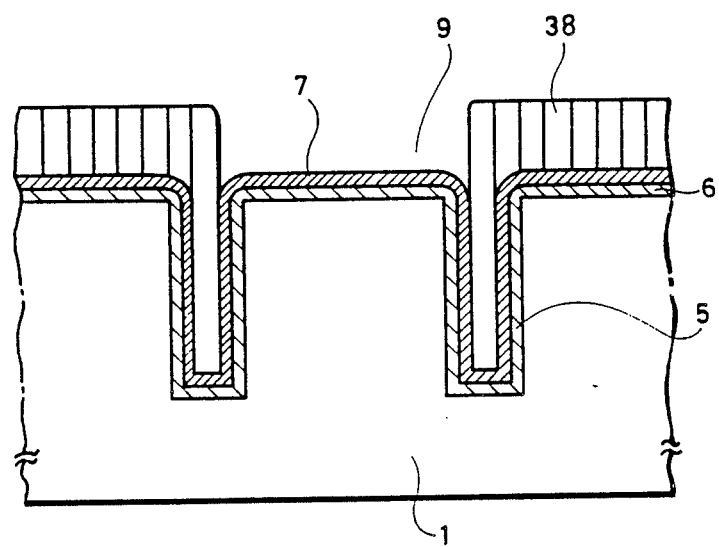

Subsequently, after the oxide film 2 is removed by a wet etching process or the like, the main surface of the semiconductor substrate 1 including the inner walls of the trenches 5 are thermally oxidized, so that a thin oxide film 6 is formed. Further, a nitride film 7 is formed over the whole surface thereof using the CVD method or the like. Resist is formed on the whole surface of the nitride film 7 including the portions of the nitride film 7 in the trenches 5 to fill the trenches and then using a photolithographic process, the resist is patterned to have openings 9. It is important that each patterned opening 9 is formed to slightly exceed a region of the semiconductor substrate 1 between the adjacent trenches 5, that is, the opening 9 is formed to expose a part of the nitride film 7 formed on a side surface of each trench (as shown in FIG. 7C).

Figure 7D:
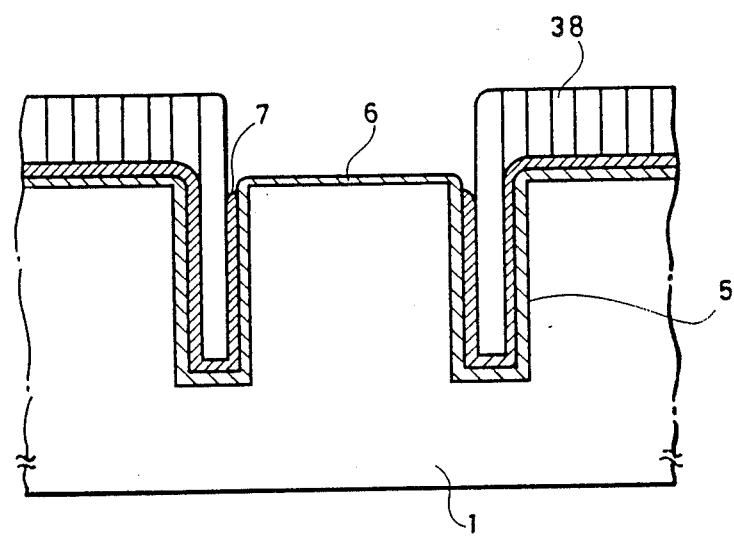

Using the resist 38 as a mask, the exposed nitride film 7 is etched and removed. The portions of the nitride film 7 on the side surfaces of the respective trenches 5 may be a little overetched because those portions are etched in the depth direction of the trenches 5. As the result, the exposed oxide film 6 is not only on a region of the semiconductor substrate 1 between the trenches 5 but also on top portions of the side surfaces of the trenches 5 (as shown in FIG. 7D).

Figure 7E:
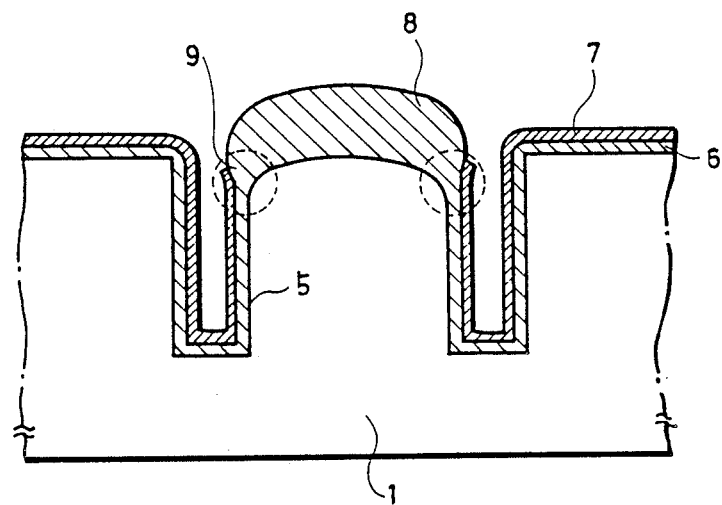

Finally, after the resist 38 is removed, field oxidation is applied by using the remaining nitride film 7 as a mask, whereby an isolation oxide film 8 is formed on the region of the semiconductor substrate 1 placed between the trenches 5 with the bird's beaks 9 being located on the side surfaces of the adjacent trenches 5 as shown by the dotted lines (as shown in FIG. 7E).

After the nitride film 7 and the oxide film 6 are removed, the main surface of the semiconductor substrate 1 including the inner walls of the trenches 5 are thermally oxidized, whereby a capacitor oxide film coupled with the isolation oxide film 8 is formed over the whole surface. The subsequent steps such as the cell plate forming step are well-known and not included in the scope of the present invention. Therefore, a description thereof is omitted.

Figure 8:
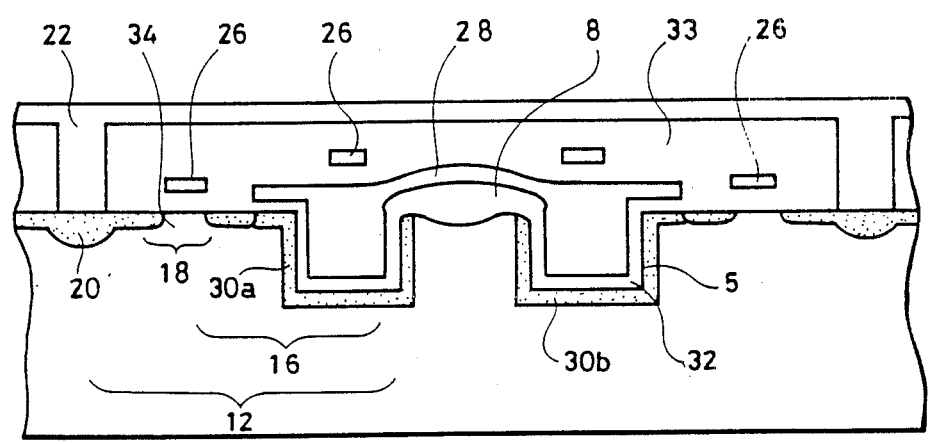
FIG. 8 is a sectional view showing a structure of memory cells of a DRAM according to an embodiment of the present invention.

FIG. 8 is a sectional structural view of the memory cells of a DRAM according to an embodiment of the present invention.

Figure 1:
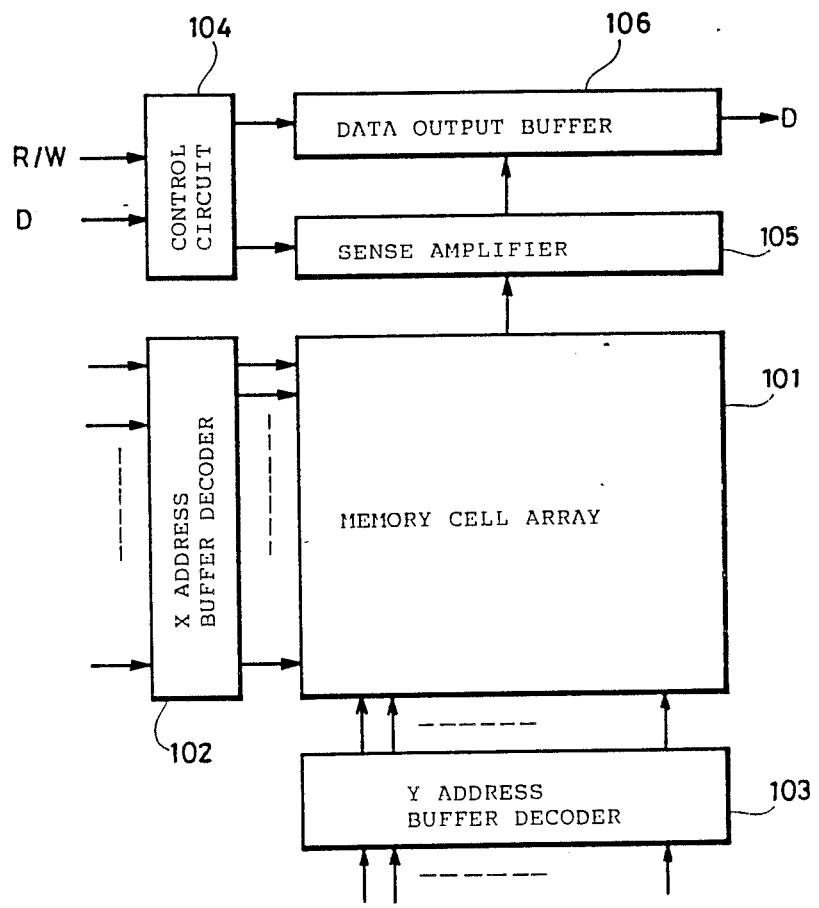
FIG. 1 is a block diagram showing an example of a configuration of a general DRAM.
Figure 2:
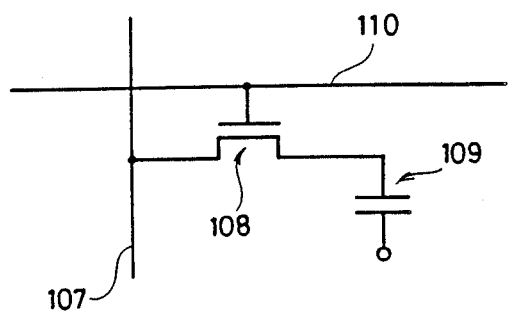
FIG. 2 is an equivalent circuit diagram of a memory cell shown for explanation of write/read operation of a memory cell in FIG. 1.
Figure 3:
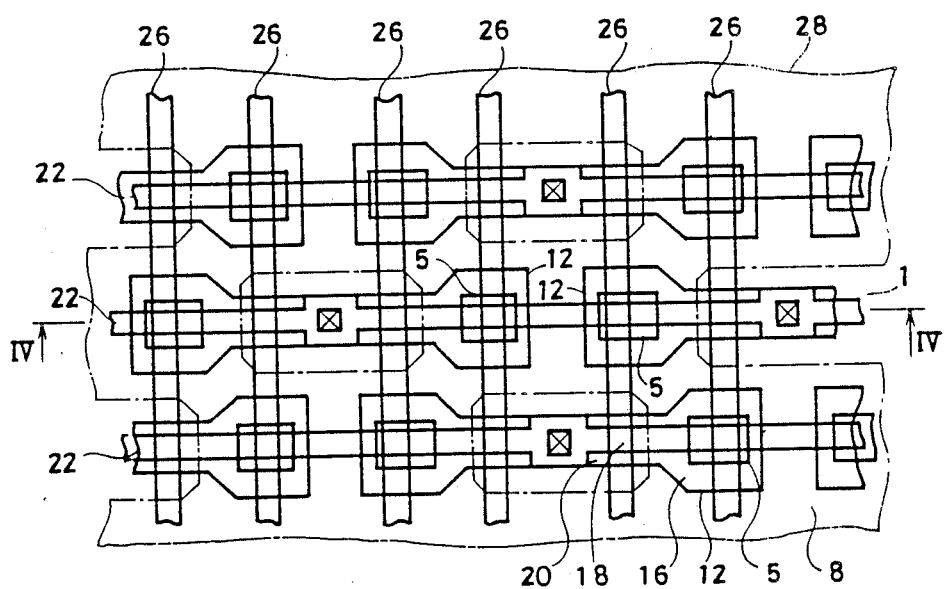
FIG. 3 is a plan view of a DRAM of a folded bit line system using the general trench type memory cells.
Figure 4:
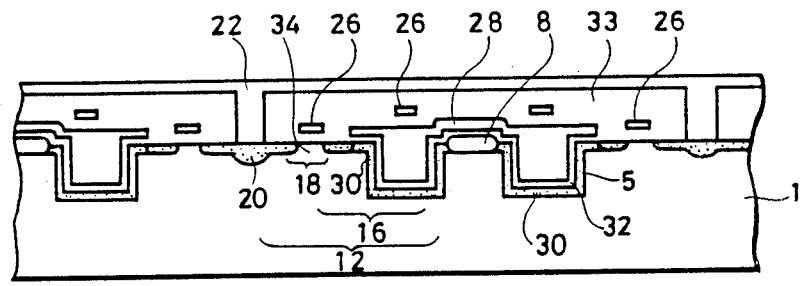
FIG. 4 is a sectional view taken along the line IV-IV in FIG. 3, showing a sectional structure of memory cells of two bits or more.
Figure 5A:
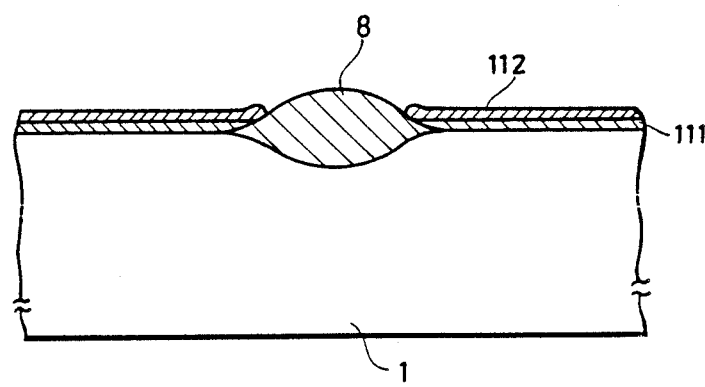
FIGS. 5A to 5E are schematic sectional views showing steps of a conventional method of manufacturing an isolation oxide film formed near trenches.
Figure 5B:
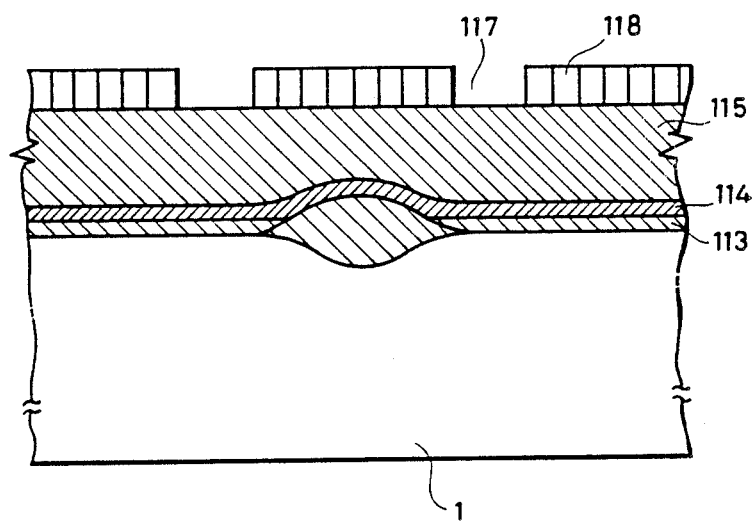
Figure 5C:
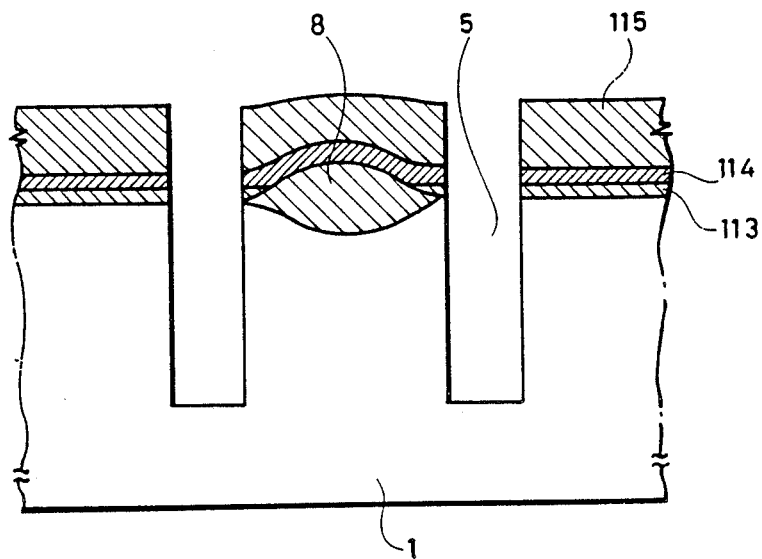
Figure 5D:
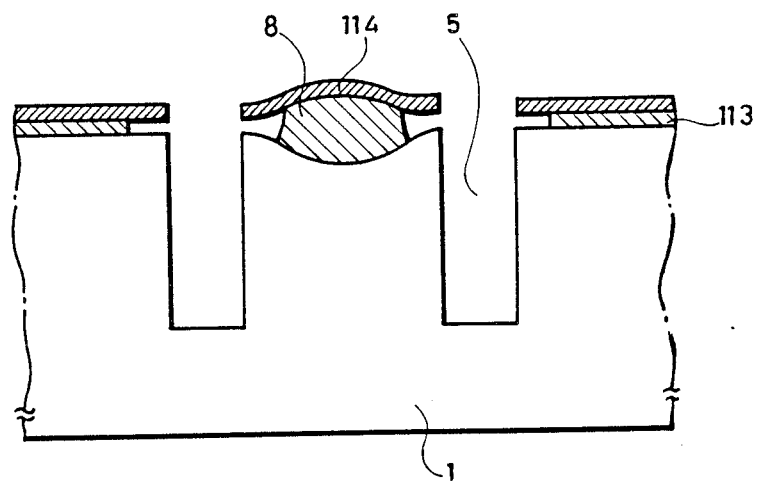
Figure 5E:
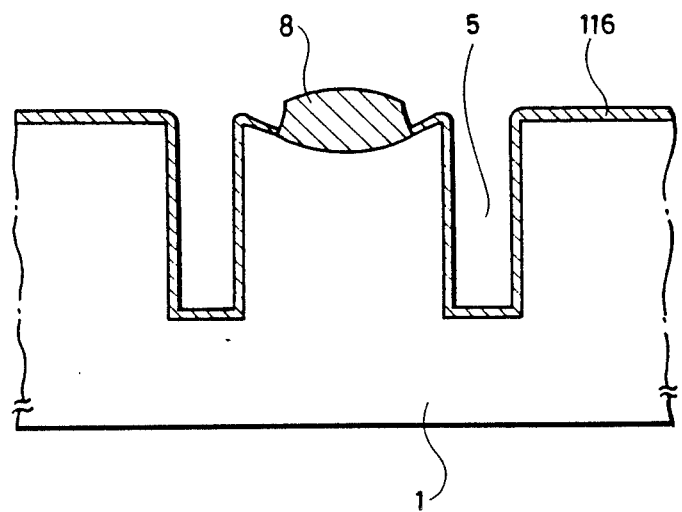
Figure 6:
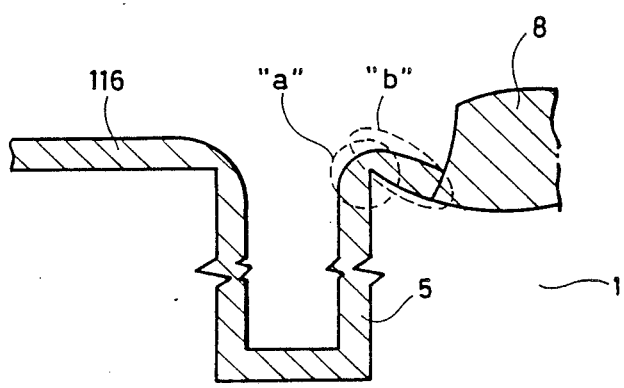
FIG. 6 is a an enlarged sectional view showing the isolation oxide film in FIG. 5E as well as an oxide film around the trench.

This figure corresponds to FIG. 4 related with the conventional device and the same reference characters are adopted.

Referring to FIG. 8, memory cells for 2 bits are shown and the isolation oxide film 8 for separation of the cells is formed by the above described above method. An edge of each trench 30 on the side of the isolation oxide film 8 is made smooth, and as can be seen from the figure, the ends of the bird's beaks of the isolation oxide film 8 are located on the side surfaces of the trenches 30a and 30b.

In the above described embodiment, two trenches are provided the isolation oxide film formed on a region between the trenches. However, a single trench may be formed and in this case, one end of the bird's beak of the isolation film is located on a side surface of the trench and the other end thereof is formed on the main surface of the semiconductor substrate.

In addition, in the above described embodiment, the bird's beaks of the isolation oxide film are located on the side surfaces of the trenches. However, if the integration degree of the cells is relatively low to allow a substantially large distance between the trenches, an isolation oxide film may be formed to have bird's beaks on the flat portions of the main surface of the semiconductor substrate between the trenches. Even in such a case, the edge portions of each trench have never an acute angle as is different from the prior art because the trenches are already formed, and thus, a higher reliability than that of the prior art is ensured.

Furthermore, in the above described embodiment, the isolation oxide film is formed on one end of each trench to solve the difficulty at the edge portion. However, sacrificial oxidation may be applied to the edge portion on the other end of each trench to solve the difficulty in the prior art.

As described in the foregoing, in the semiconductor device according to the present invention, the ends of the bird's beaks of the isolation oxide film are located on the side surfaces of the adjacent trenches and accordingly an acute edge portion is never formed on the side of the isolation oxide film and the dielectric strength of the oxide film formed on the inner walls of each trench is not lowered. Thus, the semiconductor device has a high reliability.

In addition, in the manufacturing method according to the present invention, the isolation oxide film is formed by using a mask to partially expose side surfaces of the trenches after the trenches are formed, and thus, the ends of the bird's beaks of the isolation oxide film are located on the side surfaces of the trenches.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having an isolation oxide film, comprising:
   a semiconductor substrate (1) having a main surface and a trench (5) formed on said main surface,
   a plurality of functional elements (12) formed on said semiconductor substrate (1), and
   an isolating film (8) for isolating said functional elements (12), formed on the main surface of said semiconductor substrate (1) near said trench (5), an end of a bird's beak of said isolation oxide film (8) being located on a side surface of said trench (5), said side surface of said trench (5) forming a rounded edge with said main surface of said semiconductor substrate and so that said side surface of said trench (5) and said main surface of said semiconductor substrate form an angle greater than an acute angle.

2. A semiconductor device in accordance with claim 1, further comprising
   a pair of said trenches wherein said trenches (5) are formed spaced apart at two portions on the main surface of said semiconductor substrate (1), said isolation films (8) of said trenches (5) connected to form a single contiguous isolation film (8) therebetween, the ends of respective bird's beaks (9) of said contiguous isolation film (8) being formed on the main surface of said semiconductor substrate (1) between said trenches (5) and located on inner portions of both trenches.

3. A semiconductor device in accordance with claim 1, wherein
   an oxide film (6) connecting the bird's beak of said isolation film (8) is formed on inner surfaces of said trench (5).

4. A semiconductor device in accordance with claim 3, wherein
   said semiconductor device comprises a DRAM comprising a plurality of transistors (18, 20, 26) and a plurality of capacitors (28, 30a, 30b, 32) and said oxide film (6) is a capacitor insulating film constituting said DRAM.

* * * * *